United States Patent [19]

Fang

[11] Patent Number: 5,241,275
[45] Date of Patent: Aug. 31, 1993

[54] METHOD OF MEASURING REMAINING CAPACITY OF A STORAGE CELL BY COMPARING IMPEDANCE PLOT CHARACTERISTICS

[75] Inventor: Wei-Chou Fang, Bridgewter, N.J.

[73] Assignee: AT&T Bell Laboratories, Murray Hill, N.J.

[21] Appl. No.: 708,963

[22] Filed: May 31, 1991

[51] Int. Cl.$^5$ .................. G01N 27/42; H02J 7/00
[52] U.S. Cl. .................. 324/430; 324/433; 340/636; 320/48
[58] Field of Search ........... 324/430, 433; 340/636; 320/48

[56] References Cited

U.S. PATENT DOCUMENTS

| | | | |
|---|---|---|---|
| 3,808,487 | 4/1974 | Feuillade | 324/430 X |
| 3,984,762 | 10/1976 | Dowgiallo, Jr. | 324/430 |
| 4,259,639 | 3/1981 | Renirie | 324/430 |
| 4,743,855 | 5/1988 | Randin et al. | 324/430 |
| 4,952,862 | 8/1990 | Biagetti et al. | 320/48 |

OTHER PUBLICATIONS

Vaccaro, F. J. et al, "Internal Resistance: Harbinger of Capacity Loss in Starved Electrolyte Sealed Lead Acid Batteries," *Intelec 87 Conference Proc.*, pp. 128-131 (1987).

*Primary Examiner*—Gerard R. Strecker
*Assistant Examiner*—Diep Do
*Attorney, Agent, or Firm*—David I. Caplan

[57] ABSTRACT

The remaining capacity of a storage cell, particularly a valve regulated lead-acid cell, is determined by measuring its impedance at typically two or three relatively low frequencies f, e.g., frequencies in the approximate range of 0.001 to 1.0 Hz. In one application, the imaginary part $Z''$ of the complex impedance $Z(=Z'+jZ'')$ is plotted vs. $f^{-\frac{1}{2}}$, whereby the intercept $Z''_o$ (at $f^{-\frac{1}{2}}=0$) of the bestfitting straight line of the plot is a measure of the cell's remaining capacity. In another application, the slope $(dZ''/dZ')$ of a plot of the imaginary part $Z''$ vs. real part $Z'$ of the complex impedance Z, again as measured at relatively low frequencies f, is a measure of the cell's remaining capacity.

12 Claims, 6 Drawing Sheets

METHOD OF MEASURING REMAINING CAPACITY OF A STORAGE CELL BY COMPARING IMPEDANCE PLOT CHARACTERISTICS

FIELD OF THE INVENTION

This invention relates to methods of measuring the remaining charge capacity (e.g., as measured in ampere-hours=AH) of an electrical storage cell, such as an electrolyte starved lead-acid cell (also known as "valve regulated" or "sealed" lead-acid cell).

BACKGROUND OF THE INVENTION

An important measure of the remaining discharge time period t during which a cell can deliver power to an electrical load is the cell's remaining capacity ("reserve capacity") at a constant discharging current $I_d$. Typically, this remaining capacity is measured in ampere-hours (AH). In turn, it is important to have a remotely located sensing means (connected by wires to the cell) for determining this time period $t = AH/I_d$.

Lead-acid cells generally have the property that, except for a relatively small time interval $t_o$ (approximately between 0.2 t and 0.3 t) toward the end of this time period t, the terminal voltage V of the cell is approximately constant. Thus the power $P = VI_d$ delivered to the load will be approximately constant except during the relatively small time interval $t_o$.

In a paper entitled "Internal Resistance: Harbinger of Capacity Loss in Starved Electrolyte Sealed Lead Acid Batteries," published in *Intelec 87 Conference Proceedings*, pp. 128-131 (1987), and authored by F. J. Vaccaro and P. Casson, a technique for determining the remaining capacity of a valve-regulated lead-acid cell is disclosed. In that technique an alternating voltage at 1 KHz is applied across the terminals of the cell and the impedance is measured and compared with a calibration curve. However, the technique essentially measures only the purely resistive component of the impedance of the electrolyte in the cell and therefore other relevant parameters—which depend on the history of the cell's charging and discharging, heating and cooling, etc.—cannot be detected. Thus, the only detectable failure mechanisms are loss of water—other failure mechanisms relevant to remaining capacity are not detected. In particular, the technique does not detect aging, or flaking of electrodes, or insufficient organic additive, or irreversible formation of lead sulfate, all of which depend upon the history of the cell and which deteriorate the condition of the cell, and thus reduce the actually remaining capacity of the cell, but undesirably are not detected by the technique.

In U.S. Pat. No. 4,952,862 a technique for predicting the remaining discharge time of a lead-acid storage cell for a given current is disclosed. That technique, however, requires a significant discharge of the cell to make a measurement. Such a discharge can be undesirable because of the consequent deterioration of the cell simply as a result of this required significant discharge.

It would therefore be desirable to have a technique for measuring the remaining capacity of a storage cell that mitigates the shortcomings of prior art.

SUMMARY OF THE INVENTION

This invention is based upon a recognition that measurements of remaining capacity (AH) of a cell—such as a lead-acid storage cell, particularly a valve-regulated lead-acid ("VRLA") cell—can be determined by measurements of its complex a-c impedance $Z = Z' + jZ''$ at a few relatively low frequencies f. Advantageously, these frequencies are in the approximate range between 0.001 and 1.0 Hz, (i.e., frequencies corresponding to relatively long periods $T = 1/f$ within the approximate range of 1.0 and 1,000 seconds). As known in the art, $Z'' = 2\pi L - \frac{1}{2}\pi C$, where L and C are the inductance and capacitance, respectively, (so that a positive value of $Z''$ represents a net inductance; a negative value of $Z''$ represents a net capacitance). For VRLA cells, the preferred frequency range is limited to an approximate range of between 0.001 and 0.10 Hz. During and between all these measurements of Z, substantially no discharging of the cell occurs or is allowed to occur.

In a specific embodiment, measurements of the complex impedance Z of a cell having unknown remaining capacity (AH) are made within pre-determined ranges of relatively low frequencies. A Cartesian plot of the imaginary part $Z''$ of the complex impedance Z as a function of $f^{-\frac{1}{2}}$ (i.e., as a function of the reciprocal of the square root of the frequency) is essentially a straight line whose intercept $Z''_o$ at $f^{-\frac{1}{2}} = 0$ is a measure of the actually remaining charge capacity (AH) of the cell for a given discharging current $I_d = A$. The actual, absolute value of AH for $I_d = A$ can then be determined from a straight-line calibration curve derived from measurements of a "prototype" or other cell having the same geometrical and chemical construction as that of the cell of unknown remaining capacity, the "prototype" or other cell having known respective remaining capacities and respective (corresponding) values of $Z''_o$. As used herein, the term "prototype" includes a cell built in the laboratory to simulate the construction of commercially manufactured cells.

In another embodiment, measurements of Z are made within certain frequency ranges of relatively low frequencies. A plot of the imaginary part $Z''$ versus the real part $Z'$ of the complex impedance Z in a frequency range for which the plot is essentially a straight line having a slope $(dZ''/dZ')$. This slope is a measure of the actually remaining charge capacity (AH) at a given discharging current $I_d$. The actual, absolute value of AH for $I_d = A$ can then be determined from a calibration curve derived from measurements of a "prototype" or other cell of the same construction as that of the unknown cell, the "prototype" or other cell having known remaining capacities and corresponding values of slop $(dZ''/dZ')$.

During and between all these measurements of Z in either embodiment, advantageously substantially no discharging of the cell occurs or is allowed to occur. This can be achieved by using a d-c biased, small a-c amplitude Kelvin bridge to make the measurements and by keeping the cells on open circuit between measurements.

Although it should be understood that the correctness of the theory is not essential to the success of the invention, it is theorized that measuring the complex impedances Z within the above-specified relatively low frequencies emphasizes certain important relevant cell parameters—such as electrochemical reaction times and ion diffusion times—which are relatively long times, typically of the order of 10 to 100 seconds. Also, the average ion diffusion distance is proportional to the square-root of the elapsed time, as known from the theory of ion diffusion, and that is why it is believed that a useful parameter is $f^{-\frac{1}{2}}$.

BRIEF DESCRIPTION OF THE DRAWING

This invention together with its features, characteristics, and advantages may be better understood from the following detailed description when read in conjunction with the drawings in which

FIG. 1 shows a family of best-fitting straight-line curves of the imaginary part $Z''$, of the complex a-c impedance Z of a specific (prototype) cell versus $f^{-\frac{1}{2}}$, the reciprocal of the square root of the frequency, each such curve being fitted to a plot corresponding to a fixed different remaining capacity (AH) of the cell, illustrative of one specific embodiment of the invention;

FIG. 2 shows a plot of intercept $Z''_o$ (obtained from FIG. 1) versus remaining cell capacity (AH) for the specific cell, together with a best-fitting straight line for this plot, further illustrative of said one specific embodiment of the invention;

FIG. 3 shows plots of intercepts $Z''_o$ versus remaining cell capacities for six different cells, together with a best-fitting straight line for these plots, further illustrative of said one specific embodiment of the invention;

FIG. 4 shows a family of curves for a specific (prototype) cell of its imaginary part $Z''$ versus its real part $Z'$ of its complex a-c impedance at various frequencies, each curve being for a different remaining capacity (AH) of the specific cell, further illustrative of another specific embodiment of the invention;

FIG. 5 shows a plot, together with its best-fitting straight line, of the slope $(dZ''/dZ')$ of the linear portions of each of the curves shown in FIG. 4 versus the remaining capacity (AH) of the cell, illustrative of said another specific embodiment; and FIG. 6 shows a plot, together with its best-fitting straight line, of the slopes $(dZ''/dZ')$ of six different cells versus remaining capacity (AH), further illustrative of said another specific embodiment.

DETAILED DESCRIPTION

Figure 1:
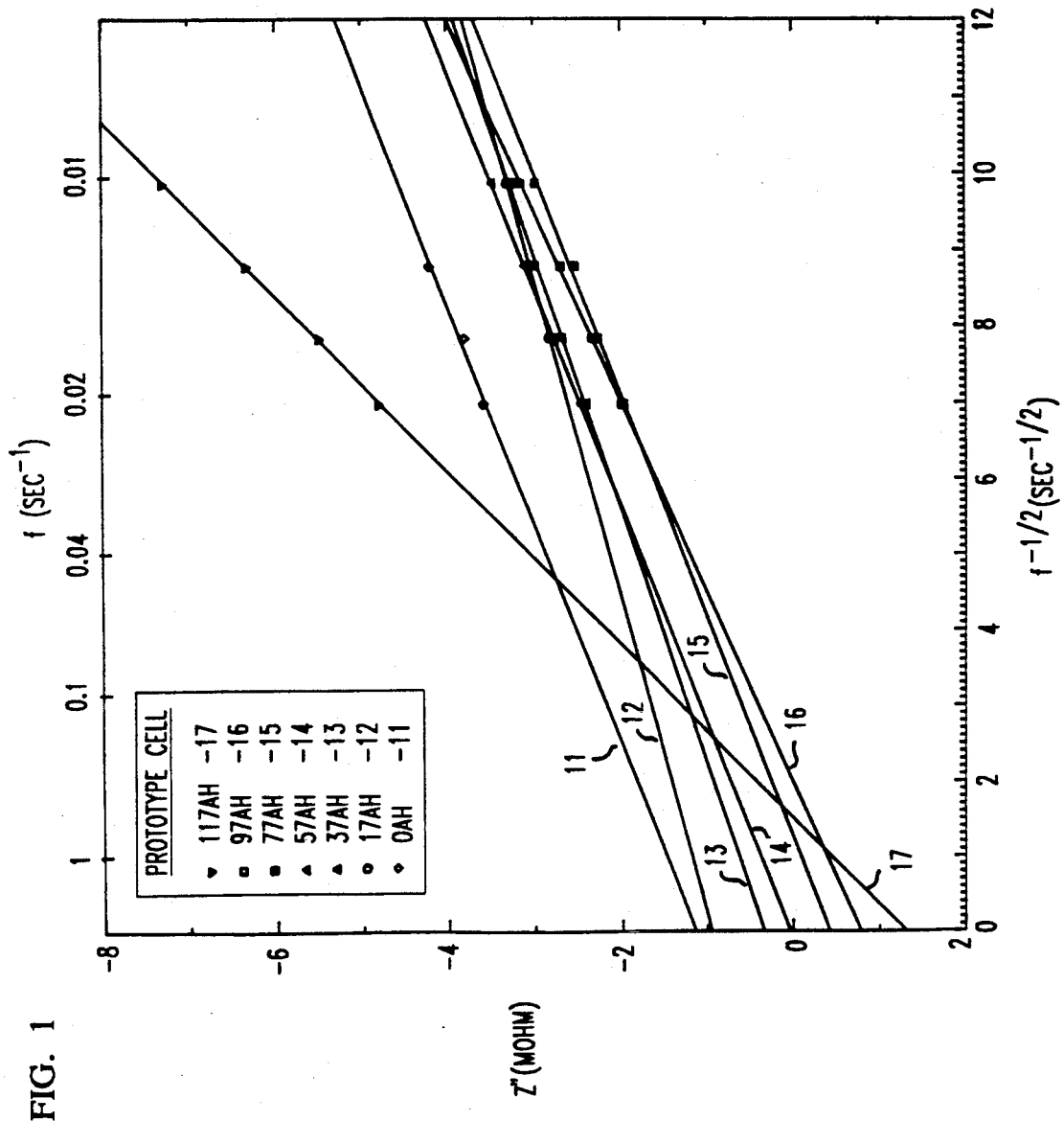
FIGS. 1-3 are useful for understanding one specific embodiment of the invention and FIGS. 4-6 are useful for understanding another. More specifically.

Referring now to the drawings, FIG. 1 shows a set of seven best-fitting straight lines 11, 12, ... 17 for the plots of negative imaginary part $(-Z'')$ of the complex impedance $Z = Z' + jZ''$ vs. $f^{-\frac{1}{2}}$ of a specific VRLA test cell with a specific history. This test cell, for example, is a specific prototype cell, built in the laboratory to simulate the construction of a commercially manufactured LA cell ("production cell"). Each plot is for a given state of remaining charge—i.e., remaining capacity (AH)—of this prototype cell; and each point of the plot is obtained, for example, with the aid of a d-c biased, small a-c amplitude (typically 1 to 5 mV) Kelvin bridge while the cell is otherwise floating (i.e., while there are no other voltages applied to the cell), as known in the art. During and between all these measurements of Z, substantially no discharging of the cell will, or is allowed to, occur. The frequencies f, at which the impedances Z are measured for all states of remaining charge, advantageously are all confined within a common frequency range ($\Delta f_1$), typically the approximate range of 0.01 Hz to 0.02 Hz, corresponding to $f^{-\frac{1}{2}}$ being within the approximate range of 10 to 7 $\sec^{-\frac{1}{2}}$ and to periods $T = 1/f$ being within the approximate range of 50 to 100 seconds.

In any event, the common frequency range ($\Delta f_1$) is selected so that all plots are substantially linear. Note that owing to the substantially (nearly) straight-line characteristic of all plots within this common range of frequencies ($\Delta f_1$), for each state of charge only two or three points need to be measured to determine a best-fitting straight line 11, 12, ... 17 for each such nearly straight line and thus to determine its intercept $Z''_o$.

It should be noted parenthetically here that all cells having the same geometrical and chemical construction as that of the prototype cell will be characterized by a substantial linearity of $Z''$ vs. $f^{-\frac{1}{2}}$ for all frequencies within the common range ($\Delta f_1$). This common linearity property makes the invention more useful, as this common frequency range ($\Delta f_1$) can later be used for determining a best-fitting straight line for $Z''$ vs. $f^{-\frac{1}{2}}$ and hence of $Z''_o$ of a cell of unknown remaining capacity (to be measured)—i.e., taking measurements of Z of each such unknown cell at only two or three frequencies within this common range.

Figure 2:
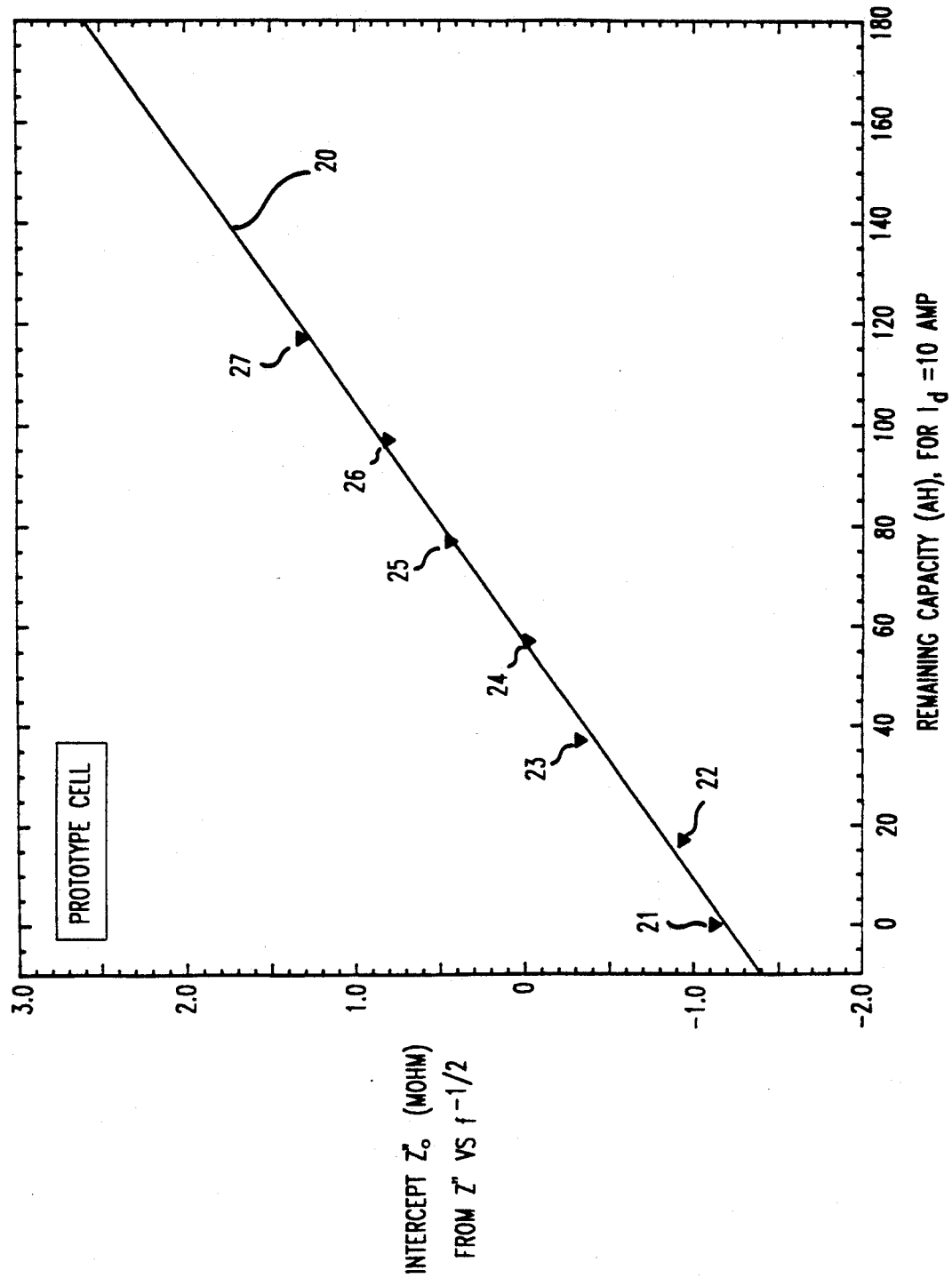

For each of the seven states of remaining charge (AH) of the prototype cell—and hence for each of the seven values of $Z''_o$ for the best-fitting straight lines 11, 12, ... 17, respectively,—the remaining capacity AH, at a discharging current $I_d = 10$ amp, is measured by a known discharging technique. Then each of the seven values of $Z''_o$ is plotted (as Cartesian ordinate) against each of the measured corresponding seven values of AH (as abscissa), whereby points 21, 22, ... 27 are plotted, as shown in FIG. 2.

For example, suppose the cell is in such a state of charge that it yields best-fitting straight-line 16 (FIG. 1)—i.e., with intercept $Z''_o$ approximately equal to $+0.79$ milli-ohm. Then suppose further that the remaining capacity of the cell (AH) is measured to be approximately equal to 97 amp-hours (as measured by means of discharging the cell at the discharging current $I_d = 10$ amp until a cut-off voltage of 1.75 V is reached). Accordingly, point 26 (FIG. 2) is plotted with its abscissa equal to 97 AH and its ordinate equal to $+0.79$ milli-ohm. Similarly, the other points 21, 22, ... 27 are plotted. Note that each of the points 21, 22, ... 27 (in FIG. 2) is labelled with a reference numeral which is equal to the reference numeral for the corresponding best-fitting straight line 11, 12 ... 17 (FIG. 1), respectively, plus ten. Note also that the points 21, 22, ... 27 fall roughly along a straight line. Best-fitting straight line 20 is then determined for theses points.

In particular, in FIG. 1 the best-fitting straight lines 11, 12, 13, ... 17, respectively, correspond to remaining charge capacities AH (at $I_d = 10$ amp) that are measured to be approximately equal to 0.0 AH, 17 AH, 37 AH, 57 AH, 77 AH, 97 AH, 117 AH, for the specific prototype cell (for the discharging current $I_d = 10$ amp). Accordingly, the abscissas for points 21, 22, ... 27 in FIG. 2 are equal to these respective values.

Generally, the precise slope and intercept of the best-fitting straight line 20 (FIG. 2) depends somewhat on the history of the prototype cell and perhaps other factors. However, for practical purposes, in accordance with one aspect of the invention, the line 20 is approximately valid for the cell regardless of its history. Indeed, for all cells having the same (geometric and chemical) construction as that of the prototype cell that was used to obtain the best-fitting straight line 20, the line 20 will still be approximately valid, so that this line 20 can be used as a (straight-line) calibration curve for all cells that have the same (geometric and chemical) construction as that of the prototype cell.

Summarizing, for any cell having an unknown remaining charge capacity, but having the same construction as that of the prototype cell and having any history, the best-fitting straight line for a plot of its imaginary part $Z''$ of impedance Z versus $f^{-\frac{1}{2}}$ is determined (without any substantial discharging of the cell), using a d-c biased Kelvin bridge in conjunction with test frequencies within the common frequency range ($\Delta f_1$) as that within the plots (FIG. 1) for the test cell formed substantially straight lines; the intercept $Z''_0$ of the best-fitting straight line is measured by extrapolation of this line to $f^{-\frac{1}{2}}=0$; and then the remaining capacity (AH) of the cell can be determined (e.g., by inspection) from the abscissa of the straight line 20 (FIG. 2) corresponding to this value of the intercept $Z''_0$. Note that, since the plot of $Z''$ vs. $f^{-\frac{1}{2}}$ for the cell of unknown remaining charge capacity within the common frequency range ($\Delta f_1$) will approximate a straight line, only two or three points need be plotted (provided the test frequencies are confined to this range).

Figure 3:
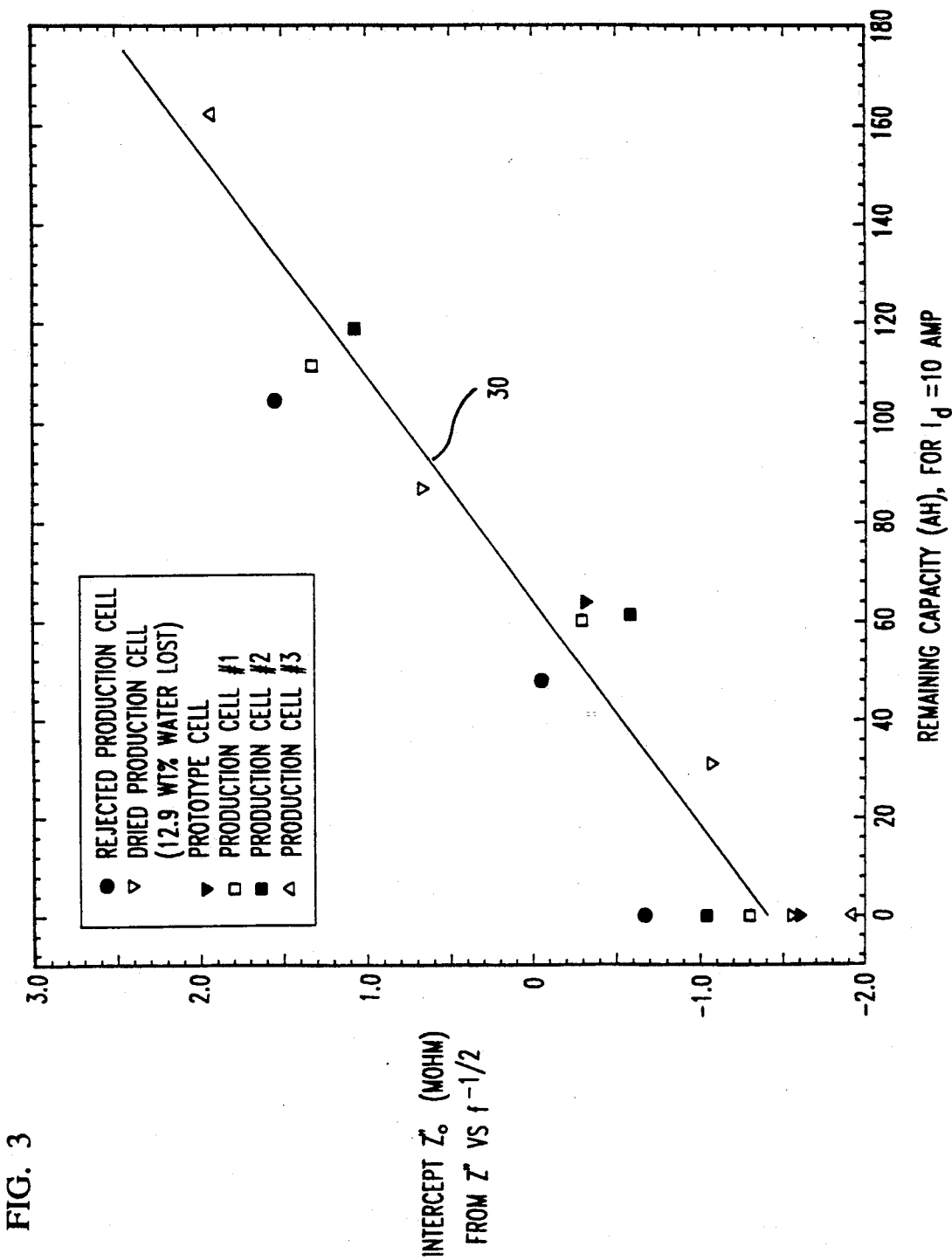

Alternatively, as indicated in FIG. 3, in accordance with another aspect of this embodiment of the invention, the intercepts $Z''_0$ for say six different cells—all having the same constructions but different histories, one of them being the prototype cell—are plotted versus (biased-Kelvin-bridge-measured) remaining capacity (AH), at $I_d = 10$ amp. All these plotted points tend to cluster along a single straight line. Thus, a best-fitting straight line 30 (FIG. 3) yields a more nearly universal (weighted-average) straight-line calibration curve for determining the remaining capacity of any VRLA cell having the same construction as that of the six cells. For example, if the intercept $Z''_0$ is measured to be equal to +1.0, then from the line 30 in FIG. 3, the remaining capacity AH is seen to be equal to approximately 112 amp-hour, again at a discharging current $I_d = 10$ amp.

Note that the slope and intercept of the straight line 20 (FIG. 2) are approximately respectively equal to those of the straight line 30 (FIG. 3). Note also that, except for the prototype cell, all the other six cells plotted in FIG. 3 represent commercially manufactured ("production") cells, with one of them having been "rejected" because it had a significantly higher internal resistance than the other production cells, and another of them being called "dried out" because it had lost 12.9 per centum by weight of its electrolyte.

Figure 4:
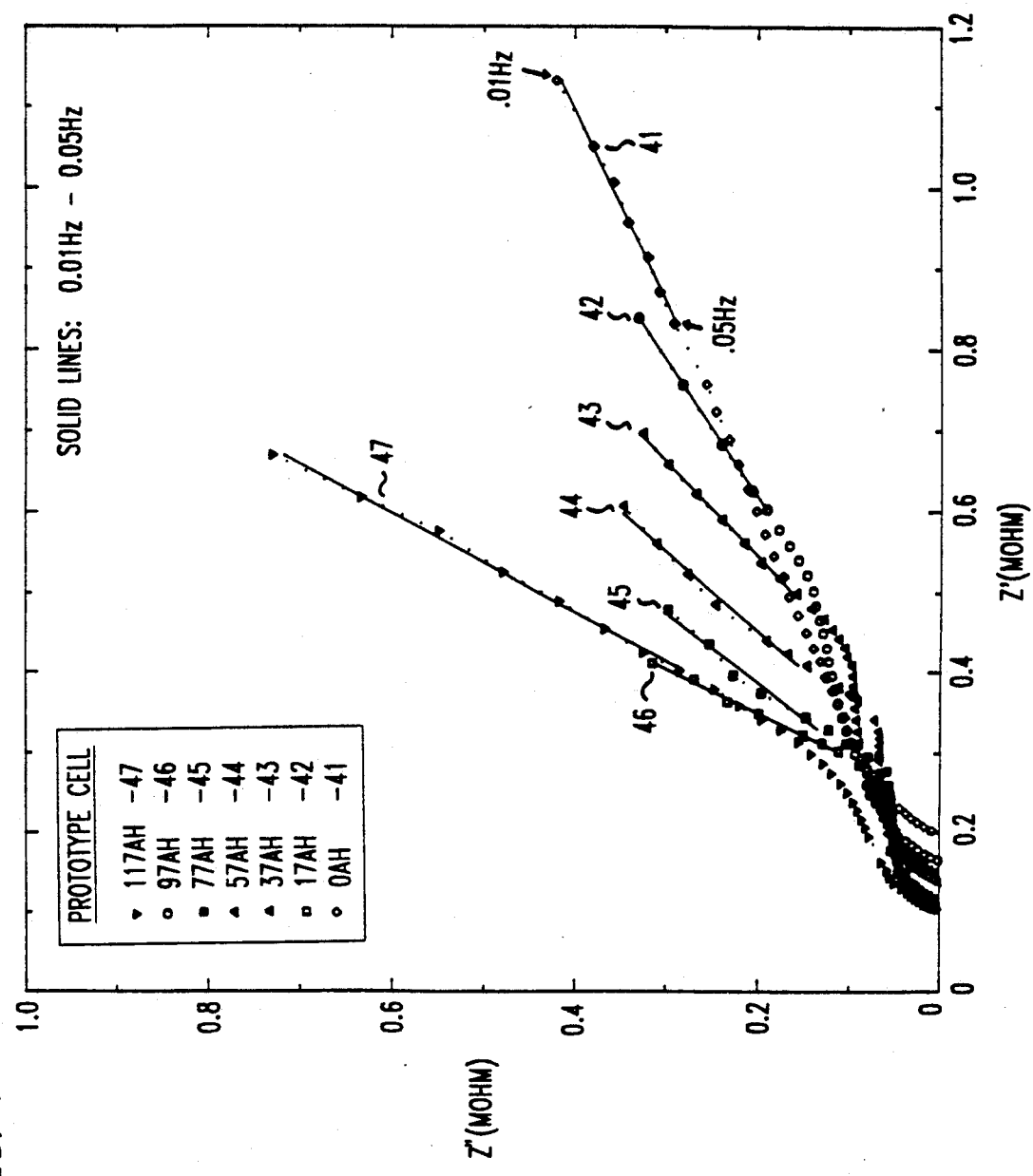
Figure 5:
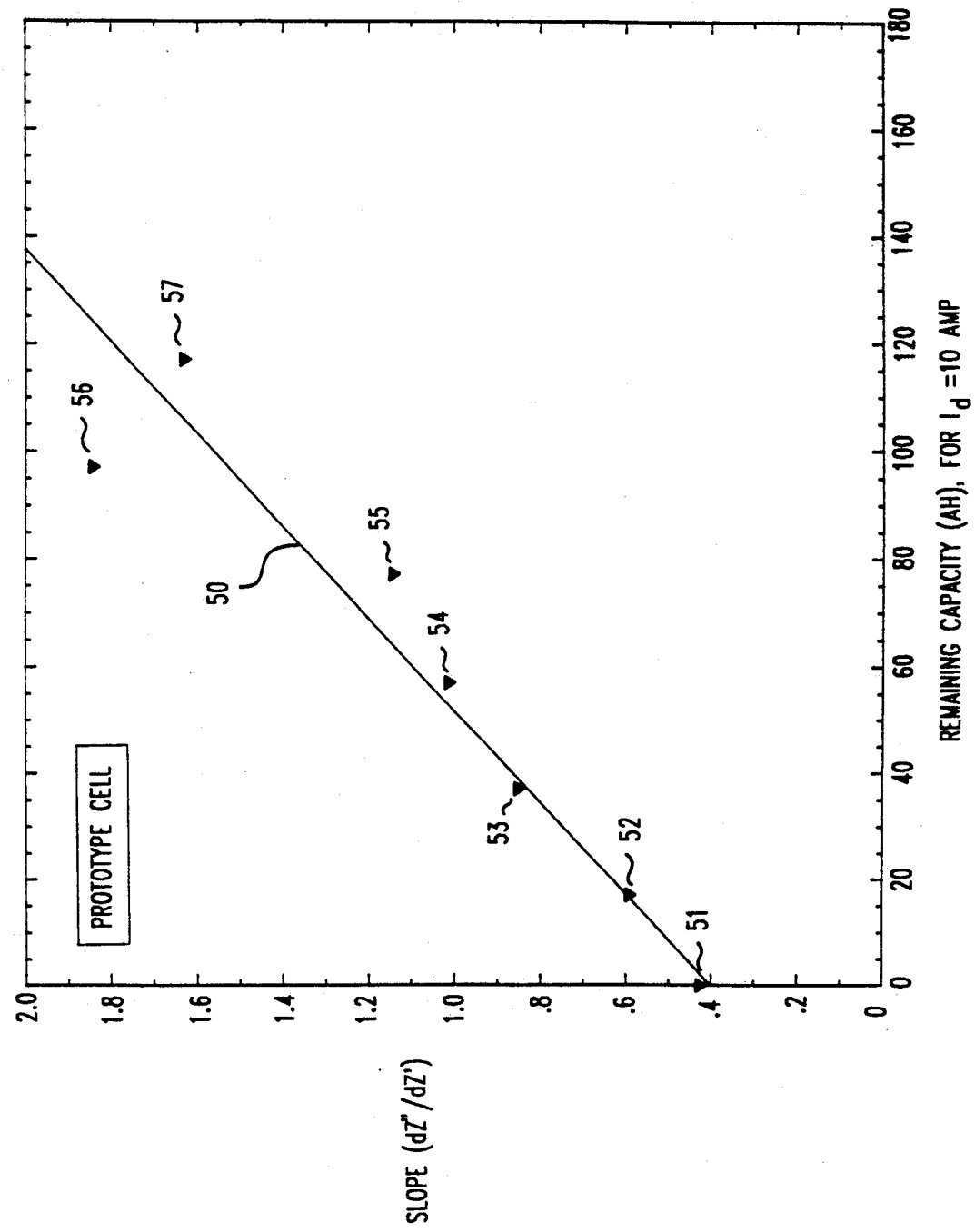
Figure 6:
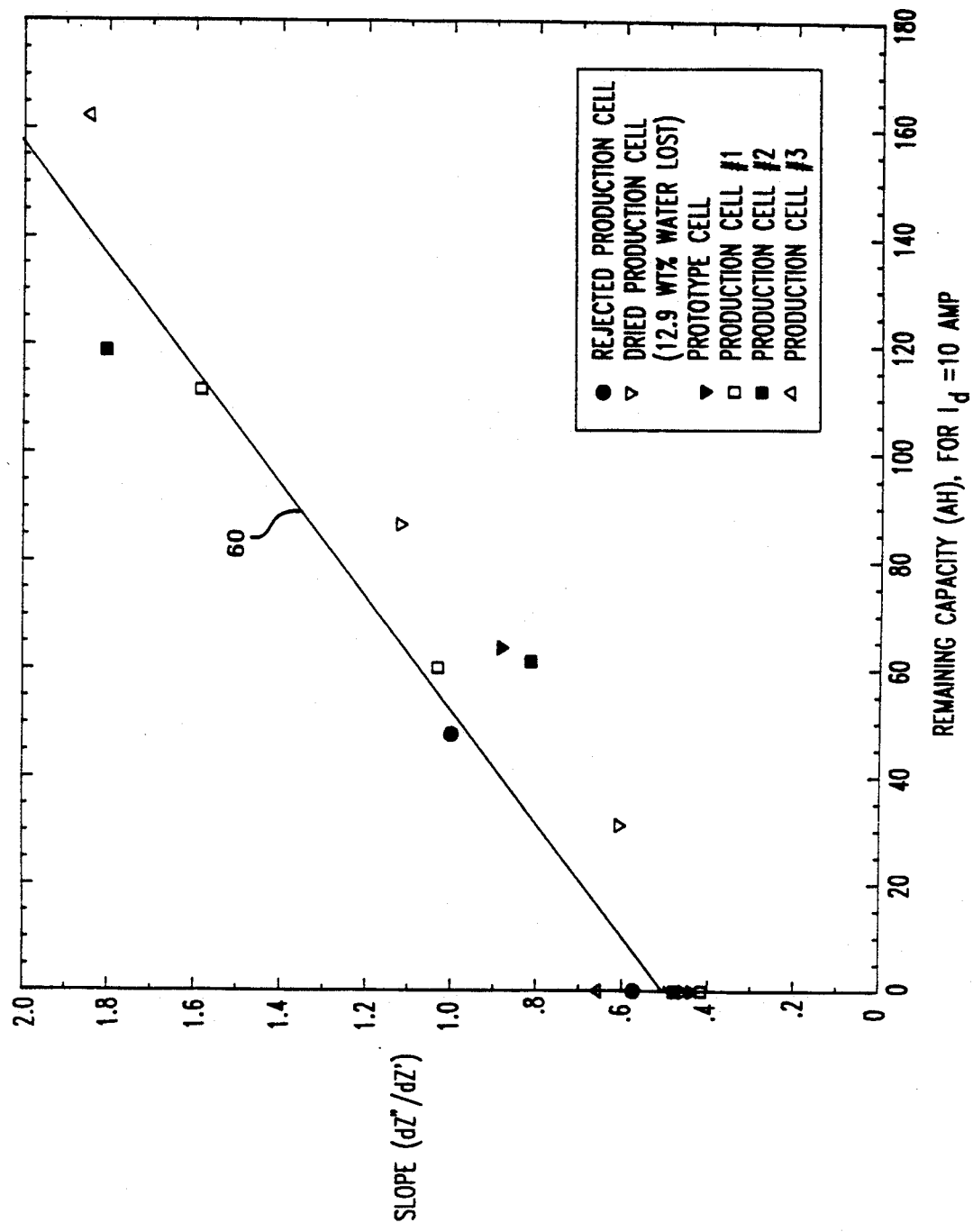

Referring now to FIG. 4, in another embodiment of the invention, values of $Z''$ and $Z'$ are measured and plotted for the prototype cell both at different frequencies f and for different known remaining capacities—for illustrative purposes, seven remaining capacities: 0.0 AH, 17 AH, 37 AH, 57 AH, 77 AH, 97 H, and 117 AH. It is found that there exists a common frequency range ($\Delta f$)$_2$ in which, for all of those (seven) remaining capacities (AH), all plots of $Z''$ vs. $Z'$, each for a given remaining capacity but for varying frequencies f, are substantially straight lines. For each remaining capacity within the common frequency range ($\Delta f$)$_2$ a best-fitting straight line 41, 42, ... 47 is determined for the respective corresponding plot of $Z''$ vs. $Z'$, and the slope ($dZ''/dZ'$) for each of these lines is found and plotted as a Cartesian ordinate (FIG. 5).

In particular, within a common frequency range ($\Delta f_2$) of approximately 0.01 to 0.05 Hz, all curves 41, 42, ... 47 are substantially linear. Again, the fact that this common frequency range ($\Delta f_2$) exists makes the invention more useful, as this common frequency range can later be used for measuring the slope ($dZ''/dZ'$) of any cell having the same construction as that of the prototype cell but having an unknown remaining charge capacity (to be determined)—taking measurements of $Z''$ and $Z'$ of each such unknown cell at only two or three frequencies within this common range (without any substantial discharging of the cell occurring during or between these measurements). At any rate, the slope ($dZ''/dZ'$) in the respective linear regions for each of these curves 41, 42, ... 47 is determined and plotted (FIG. 5) as the ordinates of points 51, 52, ... 57, respectively.

The abscissas of points 51, 52, ... 57 (FIG. 5) are respectively determined by discharging the cells at $I_d = 10$ amp to a voltage cut-off of 1.75 V. A best-fitting straight line 50 for these points is then determined. This line 50 has been found to be valid as a calibration curve for determining the remaining capacity (AH) not only of the prototype cell regardless of its history but also of any other cells having the same chemical and geometrical construction as that of the prototype cell (using the same common frequency range to measure the slopes ($dZ''/dZ'$) of the other cells as that of the prototype cell).

Alternatively, in order to obtain a more nearly universal calibration curve, instead of using the best-fitting straight line 50 (FIG. 5) as the calibration curve for cells other than the prototype cell, a straight-line calibration curve 60 for say six cells (including the prototype cell) is determined. This calibration curve 60 is the best-fitting straight line for the plotted points of the slope ($dZ''/dZ'$) vs. remaining capacities (AH) for all six cells, the slopes advantageously all being determined for a common frequency range ($\Delta f_2$) within which the plots of $Z''$ vs. $Z'$ are substantially linear for all remaining capacities (AH) for all cells. In this way, the straight-line calibration curve 60 can be used for determining the remaining capacity (AH) of an unknown cell simply by measuring its $Z''$ and $Z'$ at two or three points within that common frequency range ($\Delta f_2$), then determining the value of the slope ($dZ''/dZ'$), and finally using the earlier determined straight-line 60 to determine (e.g., by inspection) the remaining capacity (AH) for this value of the slope ($dZ''/dZ'$).

It should be understood that the common frequency ranges ($\Delta f_1$) and ($\Delta f_2$) for VRLA cells, within which the plot of $Z''$ vs. $f^{-\frac{1}{2}}$ (FIG. 1) and $Z''$ vs. $Z'$ (FIG. 4), respectively, are substantially linear can depend on the geometric and chemical construction of the cell.

Although this invention has been described in detail with reference to specific embodiments, various modifications can be made without departing from the scope of the invention. For example, instead of VRLA cells, any lead-acid or other types of electrical storage cells can be used. Instead of best-fitting straight line calibration curves 20, 30, 50, 60, other forms (shapes) of calibration curves can be determined and used to measure the remaining capacity of unknown cells. Instead of using a prototype cell for determining calibration curves 20 or 50, a production cell can be used.

I claim:

1. A method of measuring the remaining capacity of an unknown-capacity storage cell comprising the steps of:

measuring the impedances of one or more known-capacity cells each at a separate plurality of frequencies in the range of 0.001 and 1.0 Hz, followed by determining the intercept or intercepts, respectively, for each such one or more known-capacity cells, at the reciprocal of the square root of frequency equal to zero, of a best-fitting straight line of a plot of the imaginary part of the impedance of each such known-capacity cell vs. the reciprocal of the square root of the frequency at which such impedance was respectively measured for each such known-capacity cell;

measuring a first impedance of the unknown-capacity cell at a first frequency in said frequency range, followed by measuring a second impedance of the unknown-capacity cell at a second frequency, different from the first frequency, in said approximate range, followed by the step of determining the intercept, at the reciprocal of the square root of frequency equal to zero, of a straight line drawn through a plot of the imaginary part of the first and second impedances vs. the reciprocals of the square roots of the first and second frequencies, respectively;

comparing the intercept measured for the unknown-capacity cell with the intercept or intercepts measured for the one or more known-capacity cells; and determining the remaining capacity of the unknown-capacity storage cell from said comparing.

2. A method of measuring the remaining capacity of an unknown-capacity storage cell comprising the steps of measuring the imaginary part of the impedances of one or more known-capacity storage cells each at a separate plurality of frequencies in the range of 0.001 to 1.0 Hz, followed by determining the intercept for each such one or more known-capacity cell at the reciprocal of the square root of frequency equal to zero, of a best-fitting straight line of a plot of said imaginary part of the impedances of each such one or more known-capacity cell vs. the square root of the frequency at which such imaginary part of the impedance was respectively measured for each such one or more known-capacity cells;

measuring the imaginary part of the impedance of the cell at a plurality of frequencies, each such frequency being in said approximate frequency range, followed by the step of determining the intercept, at the reciprocal of square root of frequency equal to zero, of a best-fitting straight line of the imaginary part of the impedances vs. the reciprocal of the square-roots of the respective frequencies;

comparing the intercept measured for the unknown-capacity cell with the intercept or intercepts measured for the one or more known-capacity cells; and determining the remaining capacity of the unknown-capacity storage cell from said comparing.

3. The method of claims 1 or 2 in which the cell is a lead-acid storage cell.

4. The method of claim 1 or 2 in which the cell is a valve-regulated lead-acid storage cell.

5. The method of claim 4 in which the approximate frequency range is 0.10 to 0.001 Hz.

6. A method of measuring the remaining capacity of an unknown-capacity storage cell, comprising the steps of measuring the impedances of one or more known-capacity cells each at a separate multiplicity of frequencies, followed by determining the intercept or intercepts, respectively, for each of such one or more known-capacity cells, at the reciprocal of the square root of frequency equals zero, of a best fitting straight line of the imaginary part of the impedance of each such known-capacity cell vs. the reciprocal of the square root of the frequency at which such impedance was respectively measured for each such known-capacity cell;

measuring the impedances of the unknown-capacity cell at a plurality of frequencies;

determining the intercept, at the reciprocal of the square root of frequency equal to zero, of a best-fitting straight line of a plot of the imaginary part of the impedances vs. the reciprocal square roots of the respective frequencies;

comparing the intercept measured for the unknown-capacity cell with the intercept or intercepts respectively measured for the one or more known cells; and determining the remaining capacity of the unknown-capacity storage cell from said comparing.

7. A method of measuring the remaining capacity of an unknown-capacity storage cell comprising the steps of:

(a) measuring the real and the imaginary parts of the impedances of one or more known-capacity cells each at a separate plurality of different frequencies falling within a predetermined frequency range;

(b) determining the slope of a best-fitting straight line of a plot of the imaginary part vs. the real part of the measured impedances of the one or more known-capacity cells;

(c) measuring the real and the imaginary parts of the impedances of the unknown-capacity cell at a multiplicity of different frequencies falling within the predetermined frequency range, (d) determining the slope of a best-fitting straight line of a plot of the imaginary part vs. the real part of the measured impedances of the known-capacity cell;

(e) comparing the slope of step (b) with the slope of step (d); and (f) determining the remaining capacity of the unknown-capacity storage cell from said comparing.

8. The method of claim 7 in which frequency range is approximately 0.001 to 1.0 Hz.

9. The method of claim 8 in which the cell is a lead-acid storage cell.

10. The method of claim 7 in which the cell is a lead-acid storage cell.

11. The method of claim 7 in which the cell is a valve-regulated lead acid storage cell.

12. The method of claim 11 in which the frequency range is approximately 0.001 to 0.1 Hz.

* * * * *